(12) United States Patent
Wang (10) Patent No.: US 8,093,146 B2
(45) Date of Patent: Jan. 10, 2012

(54) METHOD OF FABRICATING GATE ELECTRODE USING A HARD MASK WITH SPACERS

(75) Inventor: Shiang-Bau Wang, Pingzchen (TW)

(73) Assignee: Taiwan Semiconductor Manufacturing Company, Ltd.

( * ) Notice: Subject to any disclaimer, the term of this patent is extended or adjusted under 35 U.S.C. 154(b) by 0 days.

(21) Appl. No.: 12/725,814

(22) Filed: Mar. 17, 2010

(65) Prior Publication Data

US 2011/0230029 A1    Sep. 22, 2011

(51) Int. Cl.
*H01L 21/3205* (2006.01)
*H01L 21/4763* (2006.01)

(52) U.S. Cl. . 438/596; 438/696; 438/302; 257/E21.621; 257/E21.635

(58) Field of Classification Search .............. 438/302, 438/596; 257/E21.621, E21.635; 216/46
See application file for complete search history.

(56) References Cited

U.S. PATENT DOCUMENTS

| | | | |
|---|---|---|---|
| 6,333,250 B1 * | 12/2001 | Kim | 438/595 |
| 6,489,206 B2 * | 12/2002 | Chen et al. | 438/300 |
| 6,893,919 B2 * | 5/2005 | Chuang et al. | 438/257 |
| 2002/0155690 A1 * | 10/2002 | Cabral et al. | 438/596 |
| 2004/0108598 A1 * | 6/2004 | Cabral et al. | 257/754 |
| 2006/0264018 A1 * | 11/2006 | Yin et al. | 438/595 |
| 2007/0114595 A1 * | 5/2007 | Lee | 257/321 |
| 2008/0087976 A1 * | 4/2008 | Morii et al. | 257/446 |
| 2008/0132015 A1 * | 6/2008 | Lee et al. | 438/264 |
| 2008/0233746 A1 * | 9/2008 | Huang et al. | 438/689 |

* cited by examiner

*Primary Examiner* — Caridad Everhart
(74) *Attorney, Agent, or Firm* — Lowe Hauptman Ham & Berner, LLP (57) ABSTRACT

A method for fabricating a semiconductor device is disclosed. In an embodiment, the method may include providing a semiconductor substrate; forming gate material layers over the semiconductor substrate; forming a hard mask layer over the gate material layers; patterning the hard mask layer to from a hard mask pattern; forming a spacer layer over the hard mask pattern; etching back the spacer layer to form spacers over sidewalls of the hard mask pattern; etching the gate material layers by using the spacers and the hard mask pattern as an etching mask to form a gate structure; and performing a tilt-angle ion implantation process to the semiconductor substrate.

21 Claims, 6 Drawing Sheets

METHOD OF FABRICATING GATE ELECTRODE USING A HARD MASK WITH SPACERS

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 is a flow chart of a method for fabricating an integrated circuit device according to aspects of the present disclosure; and FIGS. 2-11 are various cross-sectional views of embodiments of an integrated circuit device during various fabrication stages according to the method of FIG. 1.

DETAILED DESCRIPTION

The present disclosure relates generally to methods for manufacturing integrated circuit devices, and more particularly, to hard mask layers utilized for manufacturing integrated circuit devices.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2-11, a method 100 and a semiconductor device 200 are collectively described below. The semiconductor device 200 illustrates an integrated circuit, or portion thereof, that can comprise memory cells and/or logic circuits. The semiconductor device 200 can include active components, such as metal-oxide-semiconductor field effect transistors (MOSFETs), complementary metal-oxide-semiconductor transistors (CMOSs), high voltage transistors, and/or high frequency transistors; other suitable components; and/or combinations thereof. The semiconductor device 200 may additionally include passive components such as resistors, capacitors, inductors, and/or fuses. It is understood that additional steps can be provided before, during, and after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 1:
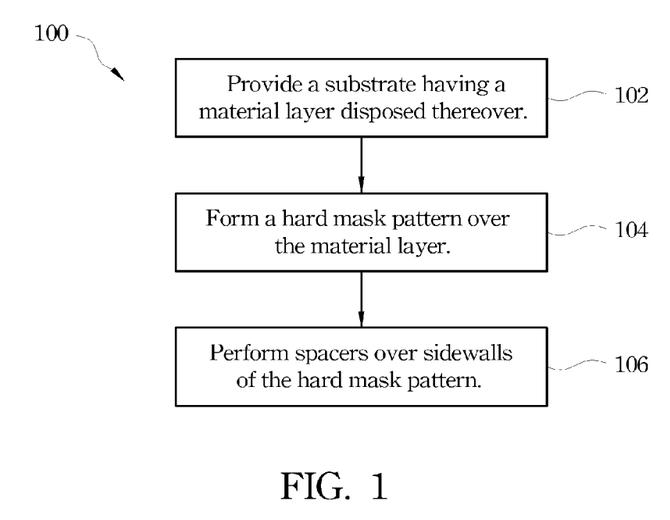
Figure 2:
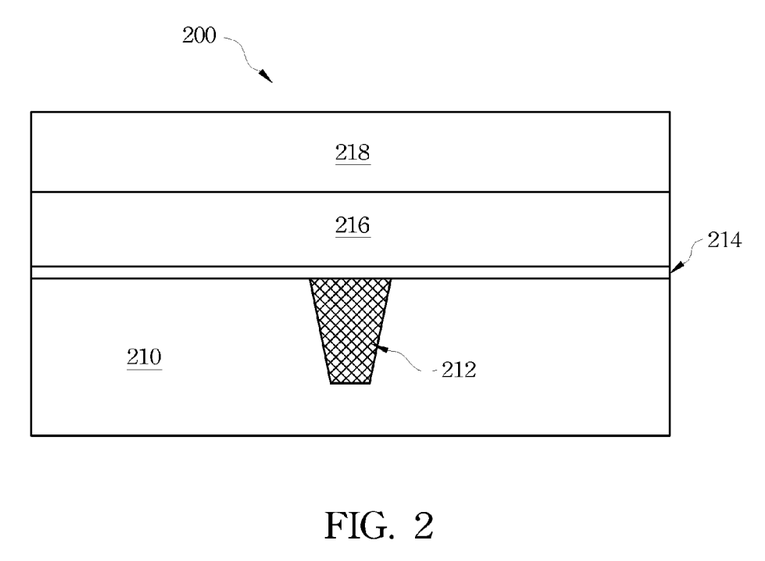

Referring to FIGS. 1 and 2, the method 100 begins at block 102 wherein a substrate 210 is provided. In the present embodiment, the substrate 210 is a semiconductor substrate comprising silicon. Alternatively, the substrate 210 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure.

The substrate 210 may include various doped regions depending on design requirements as known in the art (e.g., p-type wells or n-type wells). The doped regions may be doped with p-type dopants, such as boron or $BF_2$, and/or n-type dopants, such as phosphorus or arsenic. The doped regions may be formed directly on the substrate 210, in a P-well structure, in a N-well structure, in a dual-well structure, or using a raised structure. The semiconductor substrate 210 may further include various active regions, such as regions configured for an N-type metal-oxide-semiconductor transistor (referred to as an NMOS) and regions configured for a P-type metal-oxide-semiconductor transistor (referred to as a PMOS). It is understood that the semiconductor device 200 may be formed by CMOS technology processing, and thus some processes are not described in detail herein.

An exemplary isolation region 212 is formed in the substrate 210 to define and isolate various active regions of the substrate 210, and in the present embodiment, to isolate the NMOS and PMOS device regions. The isolation region 212 utilizes isolation technology, such as shallow trench isolation (STI) or local oxidation of silicon (LOCOS), to define and electrically isolate the various regions. In the present embodiment, the isolation region 212 includes a STI. The isolation region 212 comprises silicon oxide, silicon nitride, silicon oxynitride, other suitable materials, or combinations thereof. The isolation region 212 is formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. In some examples, the filled trench may have a multi-layer structure such as a thermal oxide liner layer filled with silicon nitride and/or silicon oxide. Then a polishing process, such as chemical mechanic polishing (CMP) process, is applied to remove the excessive dielectric materials above the top surface of the substrate, and produce a globally planarized surface.

Various gate material layers are formed over the substrate 210. In the present embodiment, the gate material layers include a gate dielectric layer 214 and a gate conductive layer (or gate electrode) 216. The gate dielectric layer 214 is formed over the substrate 210 by any suitable process to any suitable thickness. The gate dielectric layer 214 comprises a dielectric material, such as silicon oxide, silicon oxynitride, silicon nitride, high k dielectric material layer, other suitable dielectric materials, and/or combinations thereof. In various embodiments, the high-k dielectric material may comprise $HfO_2$, HfSiO, HfSiON, HfTaO, HfTiO, HfZrO, other suitable high-k dielectric materials, and/or combinations thereof. The gate dielectric layer may include a multilayer structure. In the present example, the gate dielectric layer 214 includes an interfacial layer, and a high k dielectric material layer formed on the interfacial layer. The interfacial layer comprises a grown silicon oxide layer formed by a thermal process or atomic layer deposition (ALD). The high k dielectric material can be formed by a suitable process including ALD.

The gate conductive layer 216 is formed over the gate dielectric layer 214 by any suitable process to any suitable thickness. In the present embodiment, the gate conductive layer 216 is a polycrystalline silicon (or polysilicon) layer. The polysilicon layer may be doped for proper conductivity. Alternatively, the polysilicon is not necessarily doped if a dummy gate is to be formed and is replaced in a subsequent gate replacement process. In one embodiment, the gate conductive layer 216 may comprise a conductive layer having a proper work function, therefore referred to as a work function layer. The work function layer comprises any suitable material, such that the layer can be tuned to have a proper work function for enhanced performance of the associated device. For example, if a P-type work function metal (P-metal) for a PMOS device is desired, TiN, or TaN may be used. On the other hand, if an N-type work function metal (N-metal) for NMOS devices is desired, Ta, TiAl, TiAlN, or TaCN, may be used. The work function layer may include doped conducting oxide materials. The gate conductive layer 216 may additionally comprise other conductive materials, such as aluminum, copper, tungsten, metal alloys, metal silicide, other suitable materials, and/or combinations thereof, formed on the work functional layer. The gate conductive layer can be formed by any proper technique, such chemical vapor deposition (CVD), physical vapor deposition (PVD), atomic layer deposition (ALD), high density plasma CVD (HDPCVD), plating, other suitable methods, and/or combinations thereof.

At block 104, a hard mask layer 218 is formed over the gate material layer (e.g., the gate dielectric layer 214 and gate conductive layer 216) by any suitable process. The hard mask layer 218 comprises any suitable hard mask materials. In one embodiment, the hard mask material includes silicon oxide ($SiO_2$). In one example, the silicon oxide is formed by plasma enhanced chemical vapor deposition (PECVD). In furtherance of the present example, silane (SiH4) and $O_2$ are employed to form silicon oxide. In another embodiment, the hard mask material includes silicon oxynitride (SiON). In one example, the hard mask material is formed by PECVD. In furtherance of the present example, SiH4, N2, N20, or combinations thereof is employed to form the hard mask material. The hard mask layer has a thickness ranging between about 100 angstroms and about 1200 angstroms.

Figure 3:
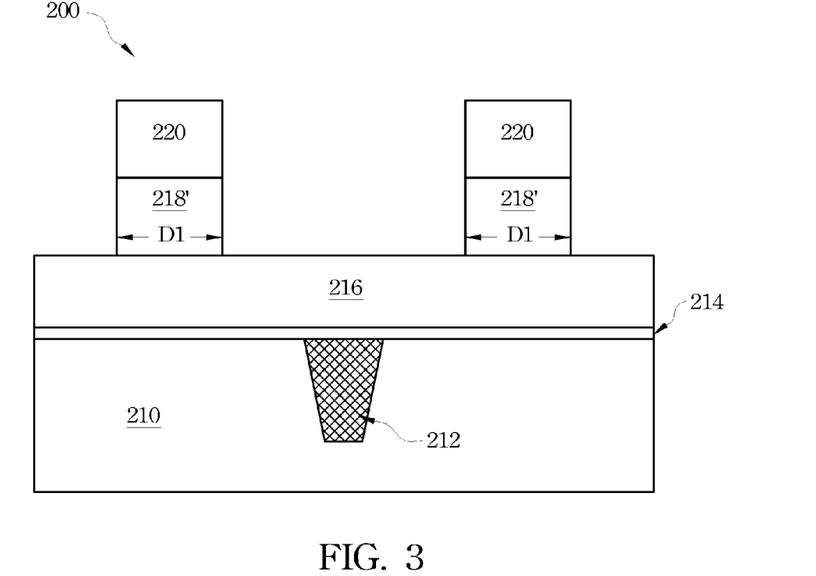

Referring to FIG. 3, photoresist patterns 220 are provided over the hard mask layer 218. For example, a layer of photoresist (not shown) is provided by a suitable process, such as spin-on coating, and patterned to form the photoresist patterns 220. Additionally, an anti-reflective coating (ARC) layer (not shown) may be formed on the hard mask layer 218 and under the layer of photoresist to enhance a subsequent patterning process as known in the art. The photoresist patterns 220 can then be transferred to the underlying hard mask layer 218 to form hard mask patterns 218' by a dry etching process know in the art. The hard mask patterns 218' may have a line width, D1, ranging between about 10 nm and about 30 nm. The photoresist patterns 220 may be stripped thereafter.

Figure 4:
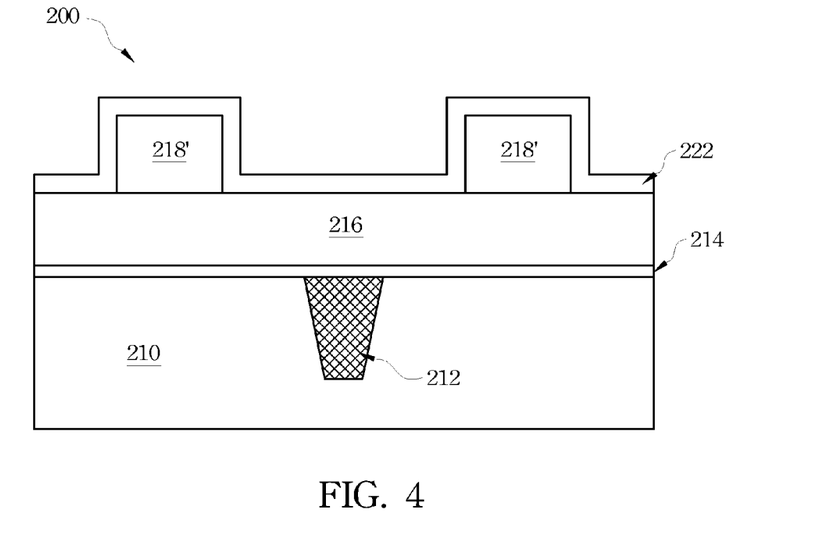

Referring to FIG. 4, a capping layer 222 is formed over the hard mask layer 218. In embodiments, the capping layer 222 is conformal and has a thickness ranging between about 1 nm and about 6 nm. In one embodiment, the capping layer 222 has higher resistance than the hard mask patterns 218 to the subsequent wet etching and/or dry etching processes. In other embodiment, the capping layer 222 is a carbon-containing layer. In another embodiments, the capping layer 222 includes silicon carbon nitride (SiCN), silicon carbide (SiC), silicon oxycarbide (SiOC), or combinations thereof. The capping layer 222 may be formed by a PVD process, a CVD process, or any other suitable processes.

Figure 5:
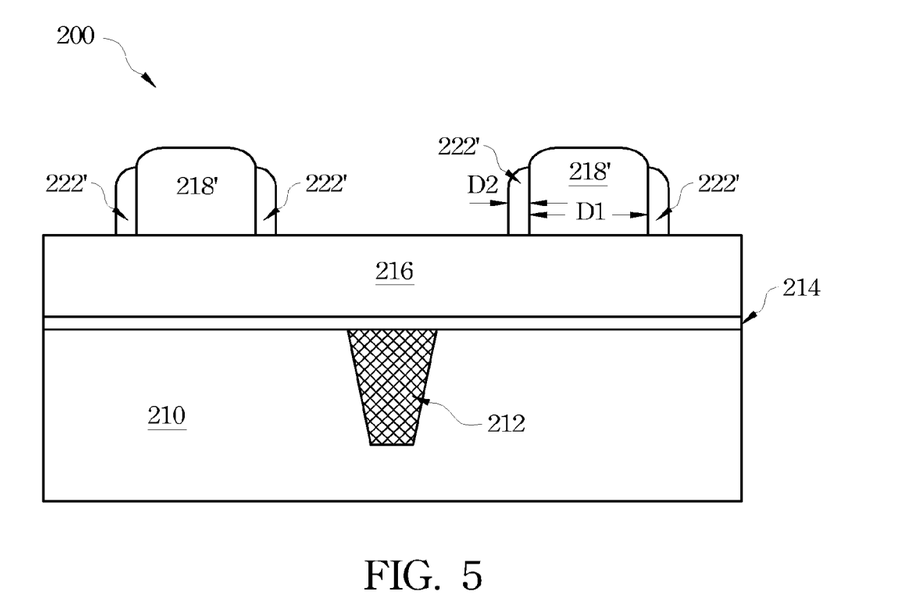

Referring to FIGS. 1 and 5, the method 100 continues to block 106 wherein spacers 222' are provided. The spacers 222' are formed by removing parts of the capping layer 222 overlying the gate conductive layer 216 and the top surface of the hard mask patterns 218', while leaving parts of the capping layer 222 overlying sidewalls of the hard mask patterns 218'. The process for forming the spacers 222', for example, is a blanket dry etching process by a plasma etcher. The spacers 222' may have a width, D2, ranging between about 1 nm and about 6 nm, or any other suitable width to comply the deign requirements of devices. In one embodiment, the ration of D2 to D1 is ranging between about 1/30 and about 1/5.

Top surface of the hard mask patterns 218' may be partially consumed during the formation process of the spacers 222'. Sidewalls of the hard mask patterns 218' are not damaged or affected by the formation process or the other subsequent dry/wet etching processes because of adapting the spacers 222' as protector. Hence, a designed width of D1 could be ensured without changing. As mentioned above, the capping layer 222 has higher resistance to the subsequent wet etching and/or dry etching processes and therefore has minor change on the width D2 during the subsequent wet etching and/or dry etching processes. The hard mask pattern 218' and its overlying two sidewall spacers form a combined hard mask pattern with a relatively reliable combined line width (D1+ D2*2).

Figure 6:
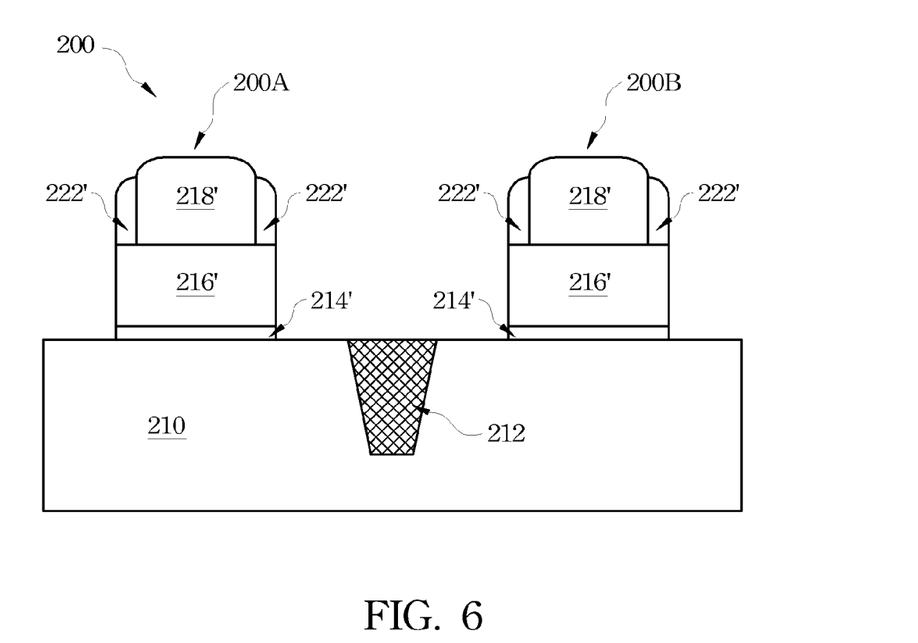

Referring to FIG. 6, an etching process, including dry etching, wet etching, and/or other etching methods (e.g., reactive ion etching) is provided to from gate structures of PMOS device 200A and NMOS device 200B by using the combined hard mask pattern as an etching mask. Each of the gate structures includes a gate electrode 216' overlying a gate dielectric 214'. The gate structures has a target width defined the combined hard mask patterns. The processes for forming the spacers 222', the gate electrode 216', and the gate dielectric 214' could be conducted in one single etching process or by separate etching process in one or several etching chambers.

Figure 7:
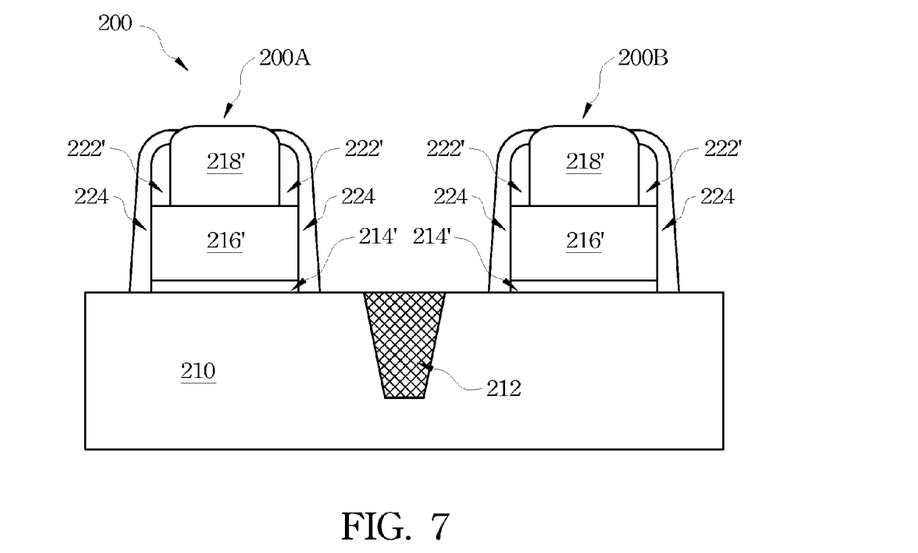

Referring to FIG. 7, offset spacers 224 are formed overlying sidewalls of the PMOS/NMOS devices 200A/200B and exterior sidewalls of the combined hard mask pattern. In an example, an offset spacers (not shown) are formed by blanket depositing a dielectric layer over the gate structures of PMOS/NMOS devices 240A/240B, the combined hard mask pattern, and the substrate 210, and then patterning the dielectric layer to form the offset spacers 224. The dielectric layer comprise, for example, silicon nitride, silicon oxide, silicon carbide, silicon oxynitride, other suitable materials, and/or combinations thereof. The thickness of the dielectric layer is ranging from 100 Å to about 300 Å. The dielectric layer may be formed by using commonly used techniques, such as plasma enhanced chemical vapor deposition (PECVD), low-pressure chemical vapor deposition (LPCVD), sub-atmospheric chemical vapor deposition (SACVD), atomic layer deposition (ALD), and the like. The patterning may be performed by either a wet etching process, a dry etching process, or combinations thereof. Preferably, the dielectric layer is patterned by a dry etching process. More preferably, the dielectric layer is patterned by an anisotropic dry etching process.

Figure 8:
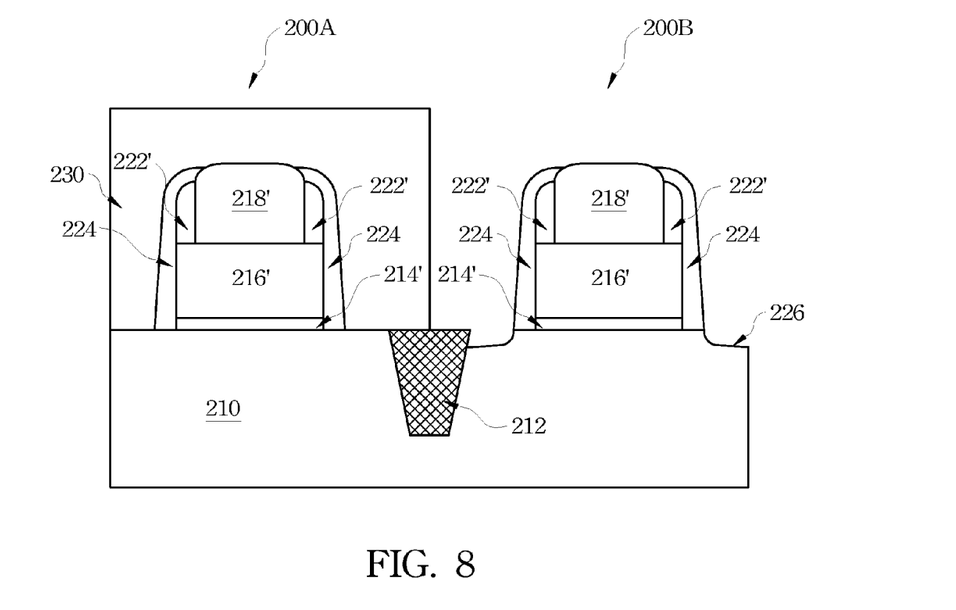

Referring to FIG. 8, recesses 226 may be optionally formed on each side of the gate structure of NMOS device 200B in the substrate 210. There are not recesses formed around the PMOS device 200A at this time by covering a protector 230, e.g., a photoresist pattern, thereon while the NMOS device 200B is exposed. The recesses 226 may be formed by any suitable process and are substantially aligned with edges of the offset spacers 224 of the gate structure of NMOS device 200B. The recesses 226 may be formed by a selective etching process, which can include one or more wet etching and/or dry etching processes. Thereafter, the protector 230 may be removed by a stripping process as known in the art.

Figure 9:
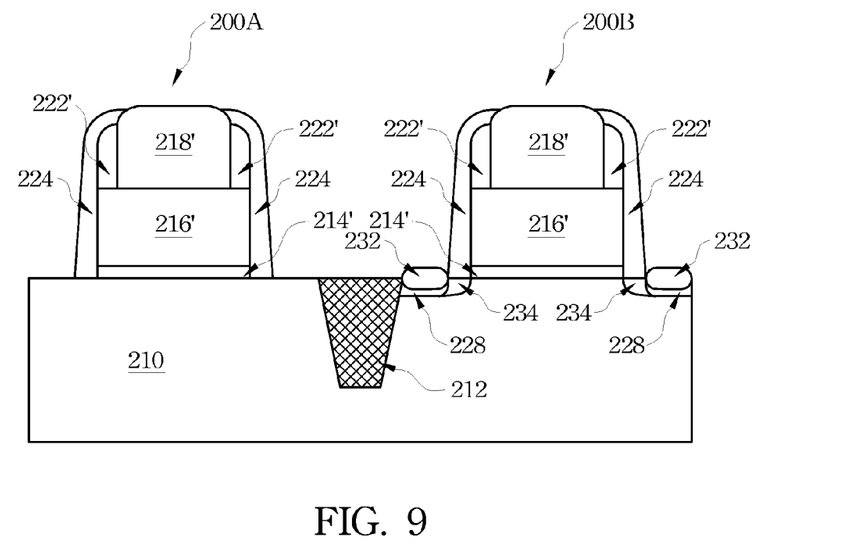

Referring to FIG. 9, N-type strained source/drain (NSSD) regions 228 are formed by any suitable process over the recesses 226 as illustrated in FIG. 8. In one embodiment, the NSSD regions 228 are formed by one or more epitaxial growth processes to any suitable thickness. An exemplary NSSD regions 228 thickness is approximately 200 Å. The epitaxial process may include CVD deposition techniques (e.g., vapor-phase epitaxy (VPE) and/or ultra-high vacuum CVD (UHV-CVD)), molecular beam epitaxy, and/or other suitable processes. The epitaxial process may use gaseous and/or liquid precursors, which may interact with the composition of the substrate 210. The NSSD regions 228 comprise any suitable material, such as epitaxially grown silicon, SiC, and/or combinations thereof. A cleaning process may be subsequently performed, such as cleaning process utilizing a DHF cleaning solution.

Subsequently, various implantation processes are performed on the substrate 210. The various implantation processes may form various doped regions. The doped regions may comprise various doping profiles and may be formed by a plurality of implantation processes. In one embodiment, N-type lightly doped source/drain (NLDD) regions 232 may be formed in or under the NSSD regions 228 by one or more ion implantation processes. The NLDD regions 232 are substantially aligned with edges of the offset spacers 224 of the gate structure of NMOS device 200B. In another embodiment, P-type pocket regions 234 may be formed adjacent to the NSSD regions 228 and under the offset spacers 224 by one or more ion implantation processes. The implantation for forming the NLDD/P-type pocket regions 232, 234 may employ tilt angle processes by any suitable angles. In one embodiment, approximately 25° to about 30° of the tilt angle is utilized.

Figure 10:
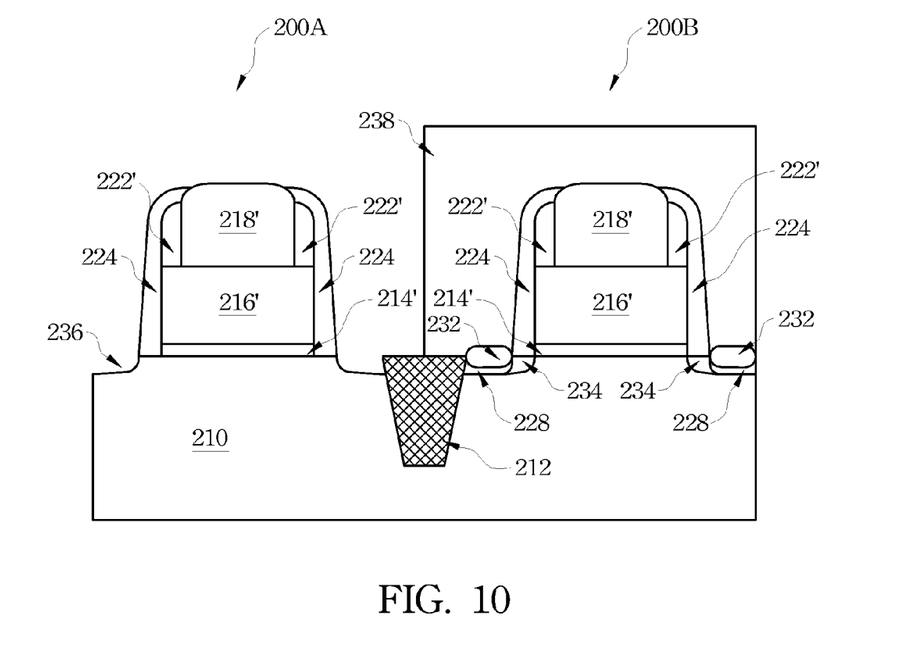

Referring to FIG. 10, recesses 236 are formed on each side of the gate structure of PMOS device 200A in the substrate 210. A protector 238, e.g., photoresist pattern, may be formed overlying the NMOS device 200B while the PMOS device 200A is exposed. The recesses 236 are formed on each side of the gate structure of PMOS device 200A by any suitable process, and are substantially aligned with edges of the offset spacers 224 of the gate structure of PMOS device 200A. The recesses 236 may be formed by a selective etching process, which can include one or more wet etching and/or dry etching processes. Then, the protector 238 is removed by a stripping process as know in the art.

Figure 11:
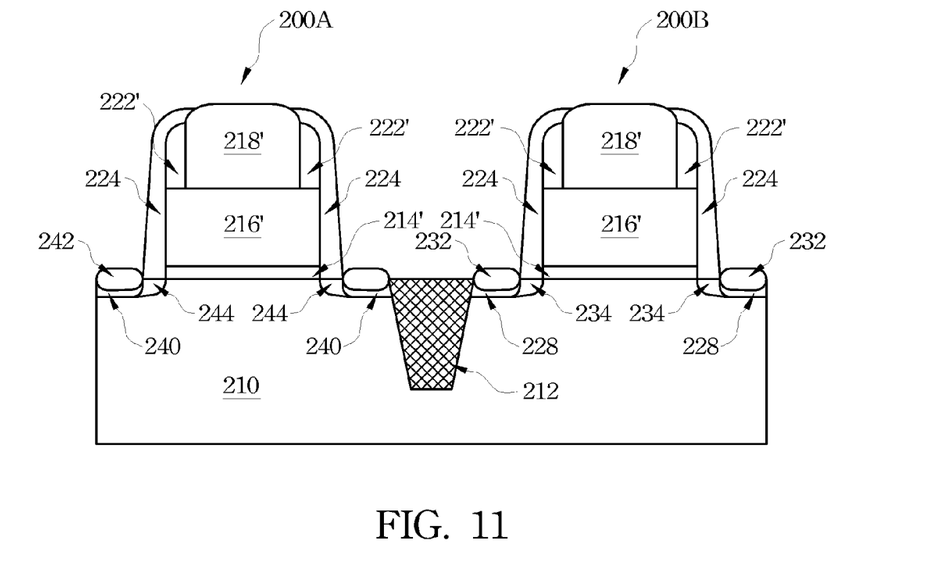

Referring to FIG. 11, the P-type strained source/drain drain (PSSD) regions 240 are formed by any suitable process over the recesses 234 as illustrated in FIG. 10. In one embodiment, the PSSD regions 240 are formed by one or more epitaxial growth processes to any suitable thickness. An exemplary PSSD regions 240 thickness is approximately 200 Å. The epitaxial process may include CVD deposition techniques (e.g., vapor-phase epitaxy (VPE) and/or ultra-high vacuum CVD (UHV-CVD)), molecular beam epitaxy, and/or other suitable processes. The epitaxial process may use gaseous and/or liquid precursors, which may interact with the composition of the substrate 210. The PSSD regions 240 comprise any suitable material, such as epitaxially grown SiGe. A cleaning process may be subsequently performed, such as cleaning process utilizing a DHF cleaning solution.

Subsequently, various implantation processes are performed on the substrate 210. The various implantation processes may form various doped regions. The doped regions may comprise various doping profiles and may be formed by a plurality of implantation processes. In one embodiment, P-type lightly doped source/drain (PLDD) regions 242 may be formed in PSSD regions 240 by one or more ion implant processes. The PLDD regions 242 are substantially aligned with the edges of the offset spacers 224 of the gate structure of PMOS device 200A. In another embodiment, N-type pocket regions 244 may be formed adjacent to the PSSD regions 240 and under the offset spacers 224 by one or more ion implant processes. The implantation for forming the PLDD/N-type pocket regions 242,244 may employ tilt angle processes by any suitable angles. In one embodiment, the angles for forming the PLDD/N-type pocket regions 242,244 are similar to the angles for forming the NLDD/P-type pocket regions 232, 234. In one embodiment, approximately about 25° to about 30° of the tilt angle is utilized.

Source/drain (S/D) regions (not shown) may be formed in the substrate 210 for the NMOS/PMOS devices 200B, 200A by a conventional implantation process. One or more contact features (not shown), such as silicide regions, may also be formed by any suitable process on the S/D regions.

Subsequent processing may implement a gate replacement process. For example, metal gates may replace the gate electrodes 216' (i.e., polysilicon gate layer) of the gate structures of the NMOS/PMOS devices 200B, 200A. A first metal gate having a first work function may be formed in the gate structure of the NMOS devices 200B and a second gate structure having a second work function may be formed in the gate structure of the PMOS devices 200A. The metal gates may comprise any suitable material including aluminum, copper, tungsten, titanium, tantulum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

Subsequent processing may form various contacts/vias/lines and multilayer interconnect features (e.g., metal layers and interlayer dielectrics) on the substrate 210, configured to connect the various features or structures of the semiconductor device 200. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated circuit device, the method comprising:
   providing a substrate;
   forming a material layer over the substrate;
   forming a hard mask pattern over the material layer;
   forming carbon-containing spacers over sidewalls of the hard mask pattern, wherein the hard mask pattern and the spacers form a combined hard mask feature;
   patterning the material layer using the combined hard mask feature as an etching mask; and
   forming offset spacers, the offset spacers covering sidewalls of the material layer and sidewalls of the spacers.

2. The method of claim 1, wherein the material layer is poly silicon.

3. The method of claim 1, wherein the carbon-containing spacers are silicon carbon nitride, silicon carbide, silicon oxycarbide, or combinations thereof.

4. The method of claim 1, wherein the hard mask pattern has a thickness ranging between about 100 angstroms and about 1200 angstroms.

5. The method of claim 1, wherein the hard mask pattern has a width ranging between about 10 nm and about 30 nm.

6. The method of claim 1, wherein the carbon-containing spacers have a width ranging between about 1 nm and about 6 nm.

7. The method of claim 1, wherein the hard mask pattern is a silicon oxide, silicon oxynitride, or combinations thereof.

8. The method of claim 1, further comprising performing an ion implantation process to the substrate after forming the offset spacers.

9. The method of claim 1, wherein the step of forming carbon-containing spacers comprises:
   forming a spacer layer over the hard mask pattern and the substrate; and
   etching back the spacer layer.

10. The method of claim 9, wherein the step of etching back is performed by a plasma etching.

11. The method of claim 1, wherein the hard mask pattern has a first width and the spacers have a second width, the ratio of the second width to the first width is ranging between about 1/30 and about 1/5.

12. The method of claim 11, wherein the hard mask layer has a thickness ranging between about 100 angstroms and about 1200 angstroms.

13. The method of claim 11, wherein the carbon-containing spacers have a width ranging between about 1 nm and about 6 nm.

14. The method of claim 11, wherein the hard mask layer is silicon oxide, silicon oxynitride, or combinations thereof.

15. The method of claim 11, wherein the carbon-containing spacers are silicon carbon nitride, silicon carbide, silicon oxycarbide, or combinations thereof.

16. The method of claim 11, wherein the step of forming a material layer comprises:
   depositing a gate dielectric layer; and
   depositing a gate conductive layer.

17. A method for fabricating an integrated circuit device, the method comprising:
   providing a semiconductor substrate;
   forming a material layer over the semiconductor substrate;
   forming a hard mask layer over the material layer;
   patterning the hard mask layer to form a patterned feature;
   forming carbon-containing spacers over sidewalls of the patterned feature, wherein the spacers and the patterned feature form a combined hard mask pattern;
   patterning the material layer using the combined hard mask pattern as an etching mask; and
   forming offset spacers, the offset spacers covering sidewalls of the material layer and sidewalls of the spacers.

18. The method of claim 17, wherein the material layer is a gate electrode layer.

19. The method of claim 17, further comprising performing an ion implantation process to the semiconductor after forming the offset spacers.

20. A method for fabricating an integrated circuit device, the method comprising:
   providing a semiconductor substrate;
   forming gate material layers over the semiconductor substrate;
   forming a hard mask layer over the gate material layers;
   patterning the hard mask layer to form hard mask pattern;
   forming a carbon-containing spacer layer over the hard mask pattern and the semiconductor substrate, wherein the spacer layer has a high resistance to an etching process;
   etching back the spacer layer to form spacers over sidewalls of the hard mask pattern, wherein the spacers and the hard mask pattern formed a combined hard mask pattern;
   etching the gate material layers using the combined hard mask pattern as an etching mask;
   forming offset spacers, the offset spacers covering sidewalls of the gate material layers and sidewalls of the spacers;
   performing a tilt-angle ion implantation process to the semiconductor after forming the offset spacers;
   performing an etching process to the semiconductor substrate after forming the offset spacers; and
   performing an epitaxy growth to the semiconductor substrate to form an epitaxy layer adjacent to the gate structure after performing the etch process.

21. The method of claim 20, wherein the step of etching back the spacer layer is performed by a plasma etching.